US011195746B2

(12) United States Patent
Xie et al.

(10) Patent No.: US 11,195,746 B2
(45) Date of Patent: Dec. 7, 2021

(54) NANOSHEET TRANSISTOR WITH SELF-ALIGNED DIELECTRIC PILLAR

(71) Applicant: International Business Machines Corporation, Armonk, NY (US)

(72) Inventors: Ruilong Xie, Niskayuna, NY (US); Kangguo Cheng, Schenectady, NY (US); Julien Frougier, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 11 days.

(21) Appl. No.: 16/740,954

(22) Filed: Jan. 13, 2020

(65) Prior Publication Data
US 2021/0217654 A1 Jul. 15, 2021

(51) Int. Cl.
*H01L 21/76* (2006.01)
*H01L 21/762* (2006.01)
*H01L 21/02* (2006.01)
*H01L 21/22* (2006.01)
(Continued)

(52) U.S. Cl.
CPC .. *H01L 21/76224* (2013.01); *H01L 21/02532* (2013.01); *H01L 21/22* (2013.01);
(Continued)

(58) Field of Classification Search
CPC ....... H01L 21/76224; H01L 21/823431; H01L 21/02532; H01L 21/823481; H01L 29/785;
(Continued)

(56) References Cited

U.S. PATENT DOCUMENTS 5,592,007 A 1/1997 Leedy
7,923,801 B2 4/2011 Tian et al.
(Continued)

FOREIGN PATENT DOCUMENTS

CN 106415800 A 2/2017
CN 109427776 A 3/2019

OTHER PUBLICATIONS

Loubet et al., "Stacked nanosheet gate-all-around transistor to enable scaling beyond FinFET", Symposium on VLSI Technology, 2017, pp. T230-T231; (2 pages).
(Continued)

*Primary Examiner* — Mohammad M Hoque
(74) *Attorney, Agent, or Firm* — Cantor Colburn LLP; Joseph Petrokaitis

(57) ABSTRACT

Embodiments of the present invention are directed to a semiconductor structure and a method for forming a semiconductor structure having a self-aligned dielectric pillar for reducing trench silicide-to-gate parasitic capacitance. In a non-limiting embodiment of the invention, a nanosheet stack is formed over a substrate. A dielectric pillar is positioned adjacent to the nanosheet stack and on a shallow trench isolation region of the substrate. The nanosheet stack is recessed to expose a surface of the shallow trench isolation region and a source or drain (S/D) region is formed on the exposed surface of the shallow trench isolation region. A contact trench is formed that exposes a surface of the S/D region and a surface of the dielectric pillar.

3 Claims, 13 Drawing Sheets

(51) Int. Cl.
  *H01L 21/3065* (2006.01)
  *H01L 21/8234* (2006.01)
  *H01L 29/78* (2006.01)
  *H01L 29/06* (2006.01)
  *H01L 29/16* (2006.01)
  *H01L 29/66* (2006.01)

(52) U.S. Cl.
  CPC .. *H01L 21/3065* (2013.01); *H01L 21/823431* (2013.01); *H01L 21/823481* (2013.01); *H01L 29/0649* (2013.01); *H01L 29/0665* (2013.01); *H01L 29/16* (2013.01); *H01L 29/66545* (2013.01); *H01L 29/66795* (2013.01); *H01L 29/785* (2013.01)

(58) Field of Classification Search
  CPC ..... H01L 29/16; H01L 21/3065; H01L 21/22; H01L 29/0665; H01L 29/0649; H01L 29/66795; H01L 29/66545
  USPC ........................................................ 257/506
  See application file for complete search history.

(56) References Cited

U.S. PATENT DOCUMENTS

| | | | |
|---|---|---|---|
| 8,921,181 B2 | 12/2014 | Pramanik | |
| 9,281,382 B2 | 3/2016 | Liu et al. | |
| 9,287,404 B2 | 3/2016 | Poelzl | |
| 9,515,138 B1 | 12/2016 | Doris et al. | |
| 9,716,158 B1 | 7/2017 | Cheng et al. | |
| 9,735,154 B2 | 8/2017 | Wei et al. | |
| 9,812,449 B2 | 11/2017 | Obradovic et al. | |
| 9,842,914 B1 | 12/2017 | Yeung et al. | |
| 9,966,456 B1* | 5/2018 | Park | H01L 21/823487 |
| 9,984,936 B1 | 5/2018 | Xie et al. | |
| 9,997,618 B2 | 6/2018 | Cheng et al. | |
| 10,068,970 B2 | 9/2018 | Cheng et al. | |
| 10,424,639 B1 | 9/2019 | Miao et al. | |
| 10,510,620 B1* | 12/2019 | Chanemougame | H01L 29/0692 |
| 2014/0264896 A1 | 9/2014 | Lu et al. | |
| 2020/0035567 A1* | 1/2020 | Chanemougame | H01L 29/78654 |
| 2021/0020644 A1* | 1/2021 | Paul | H01L 21/02532 |
| 2021/0057525 A1* | 2/2021 | Chiang | H01L 29/1033 |

OTHER PUBLICATIONS

International Search Report; International Application No. IB2020/062389; International Filing Date: Dec. 23, 2020; dated Apr. 22, 2021; 11 pages.

* cited by examiner

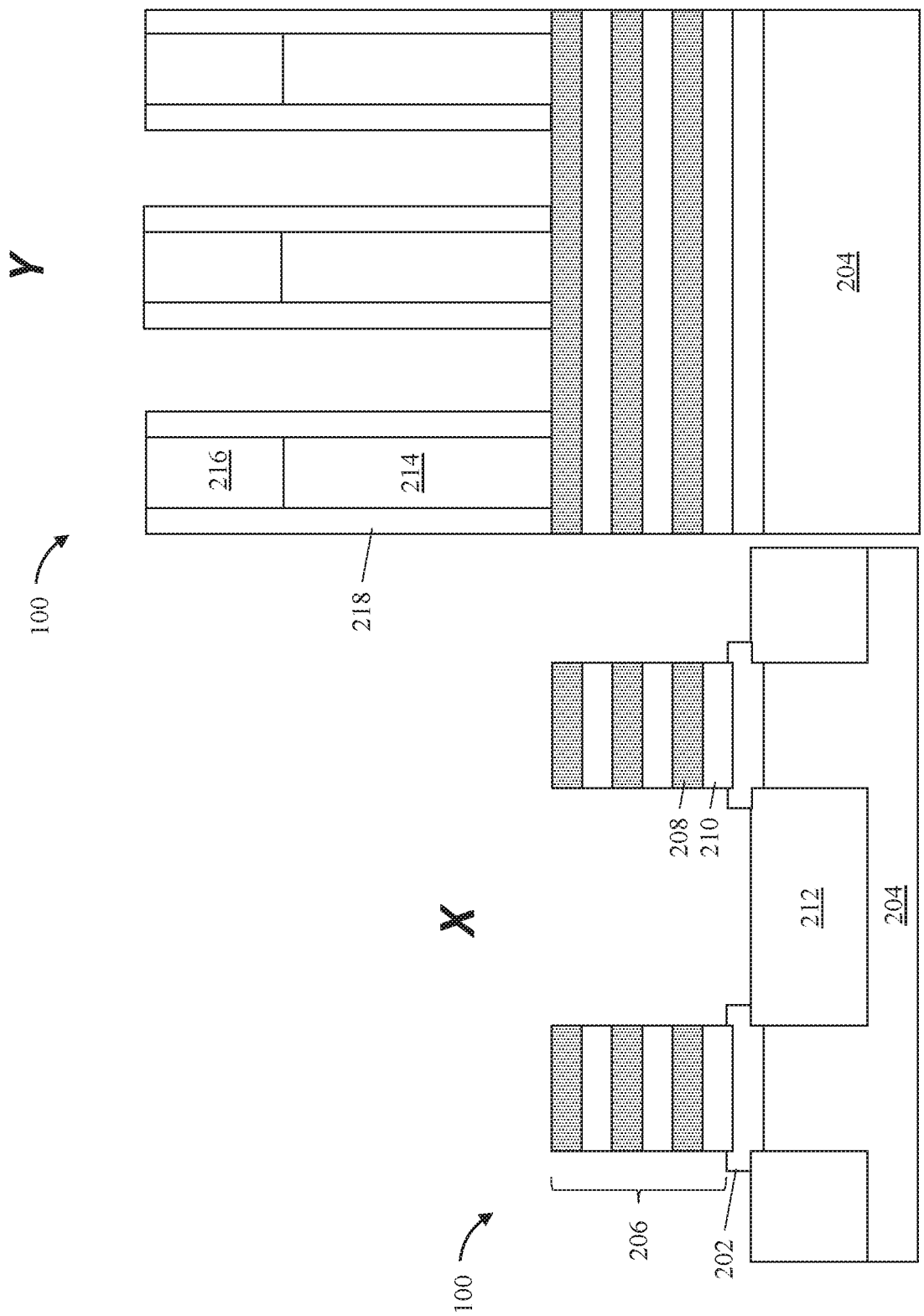

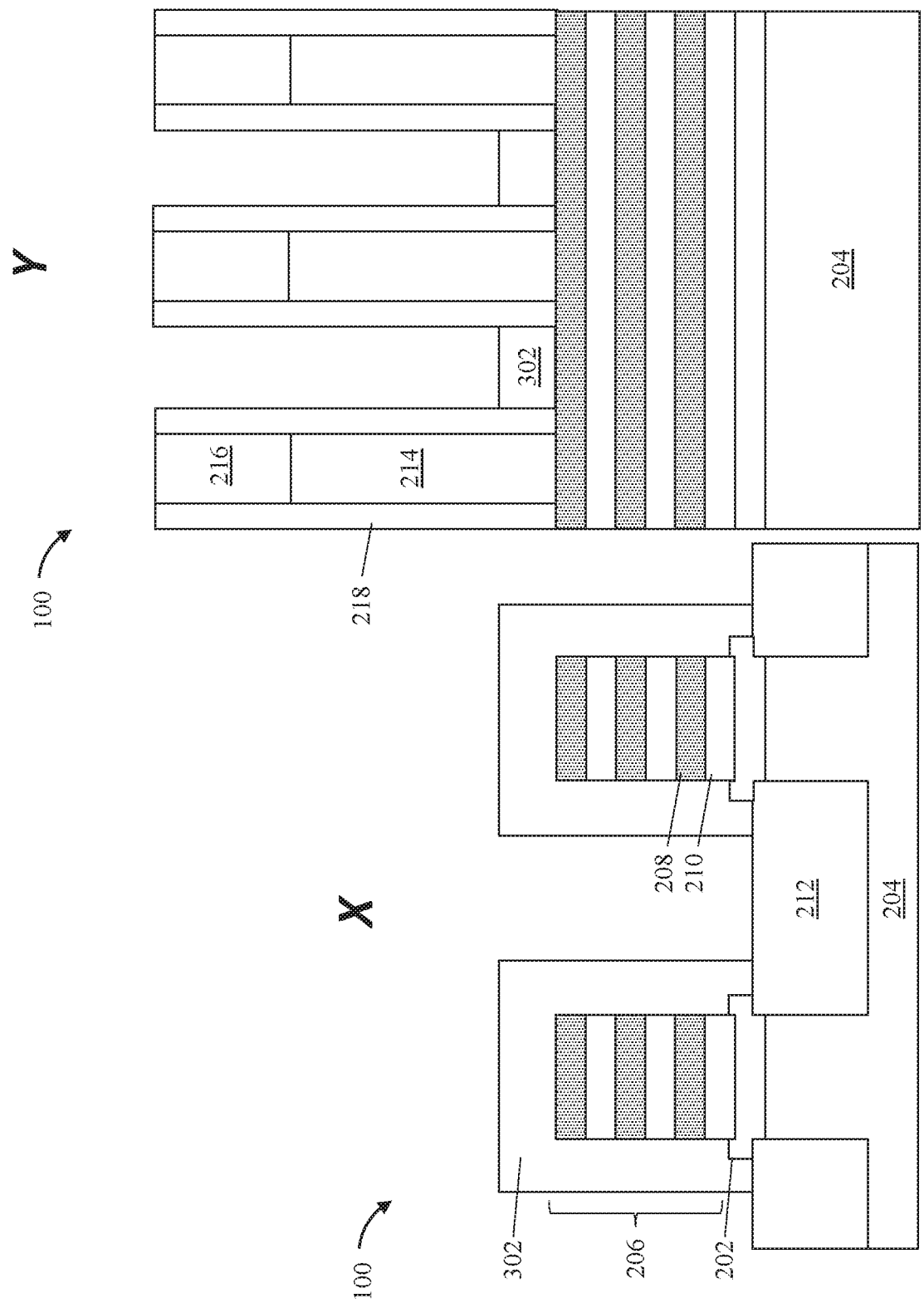

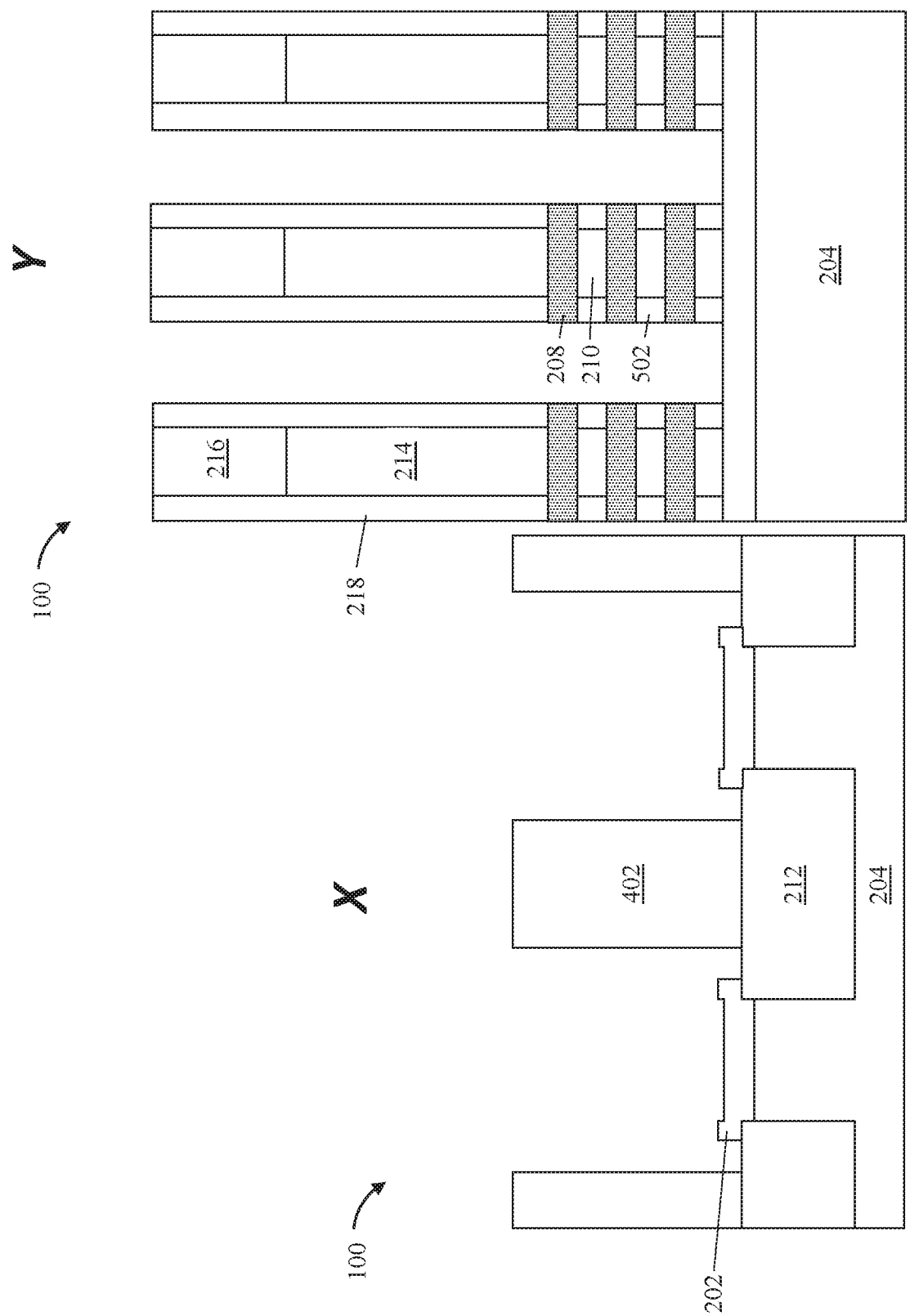

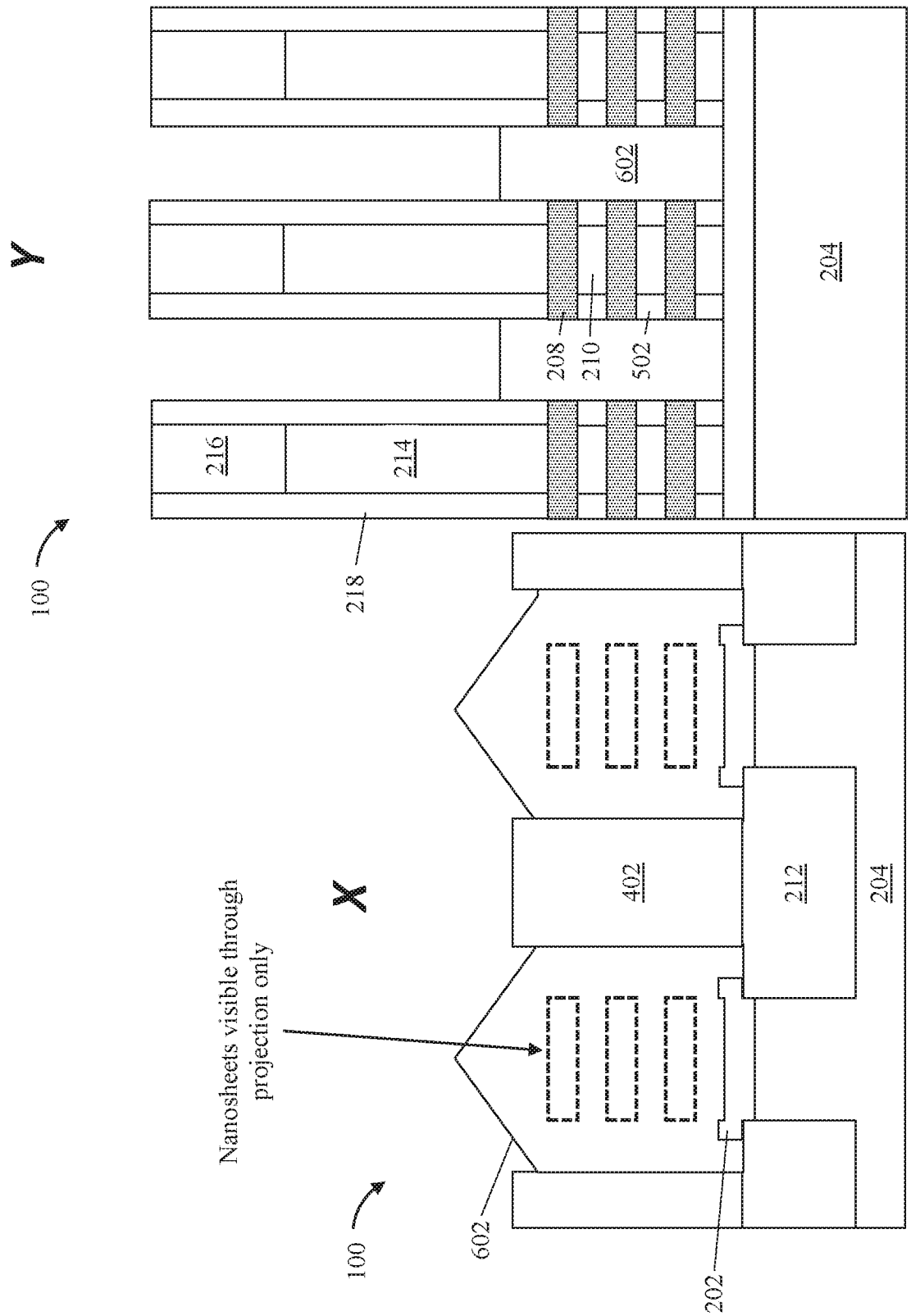

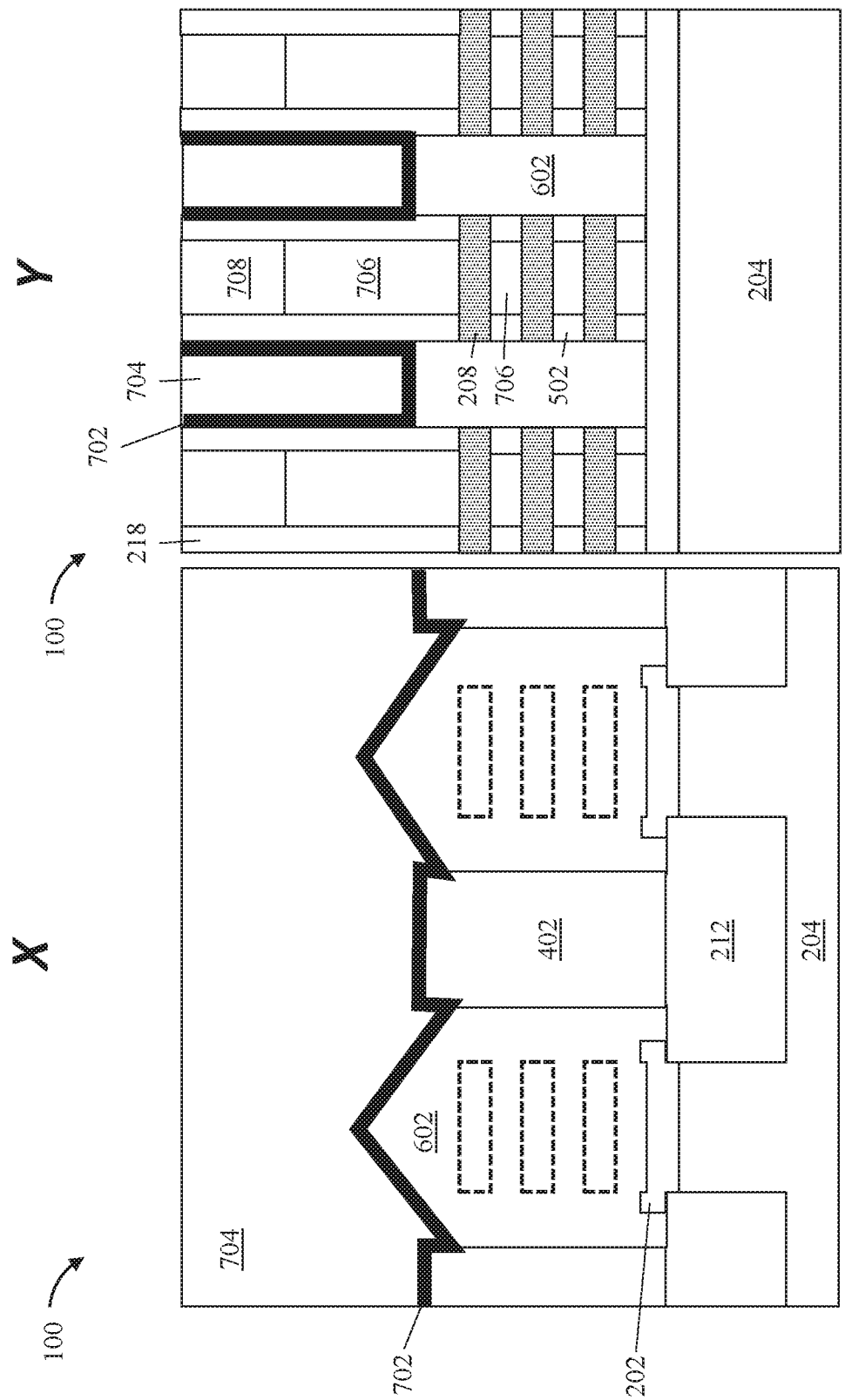

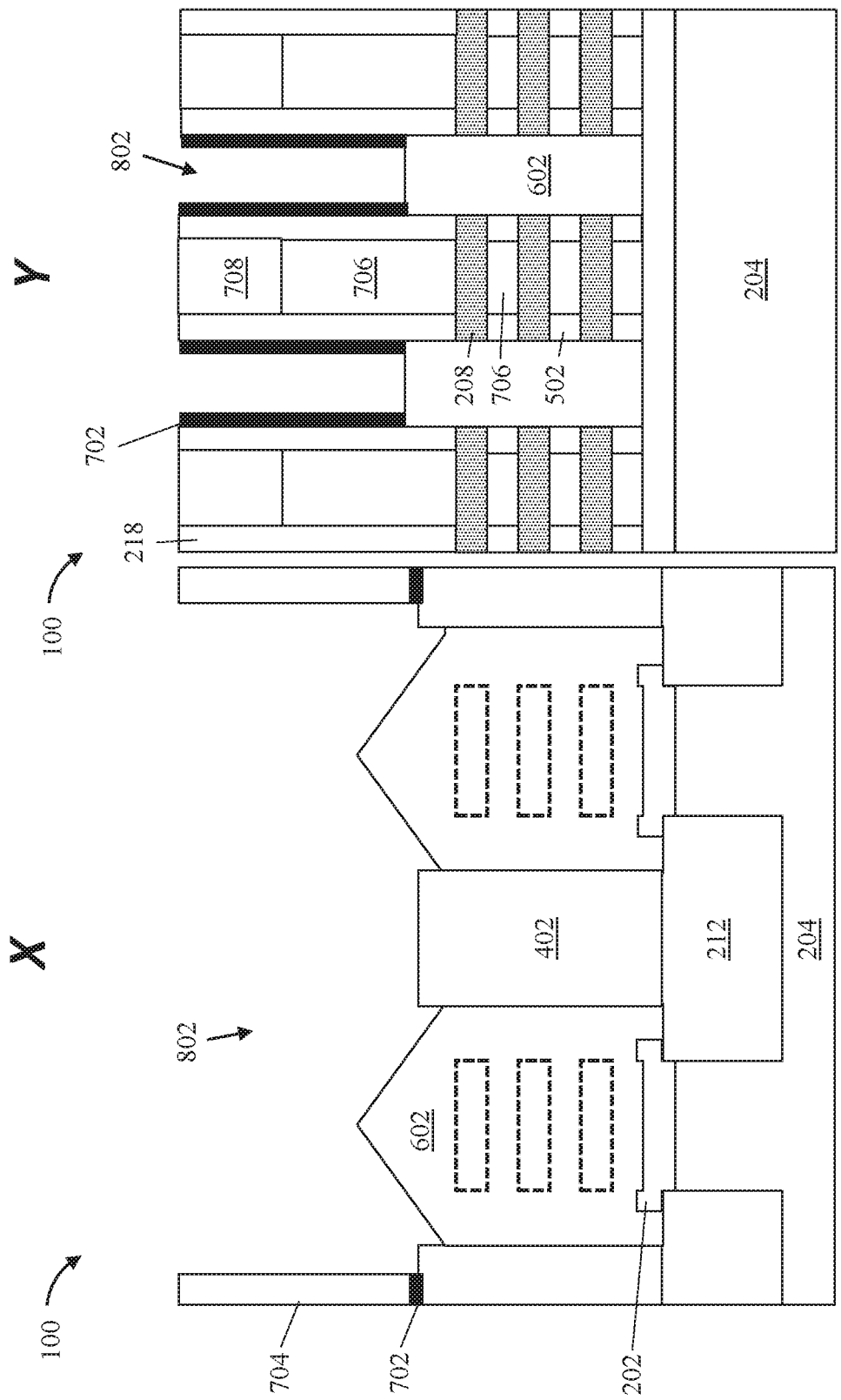

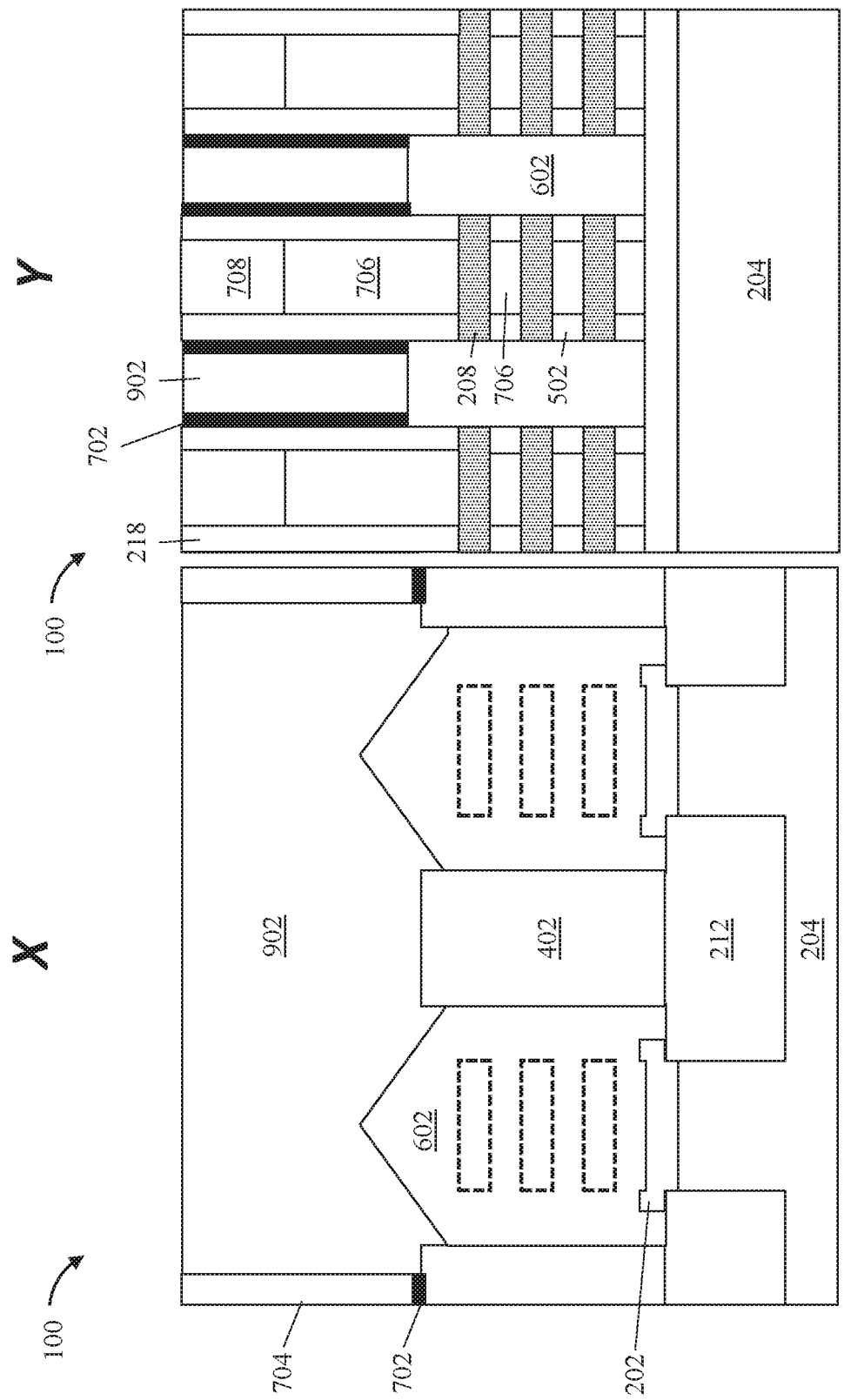

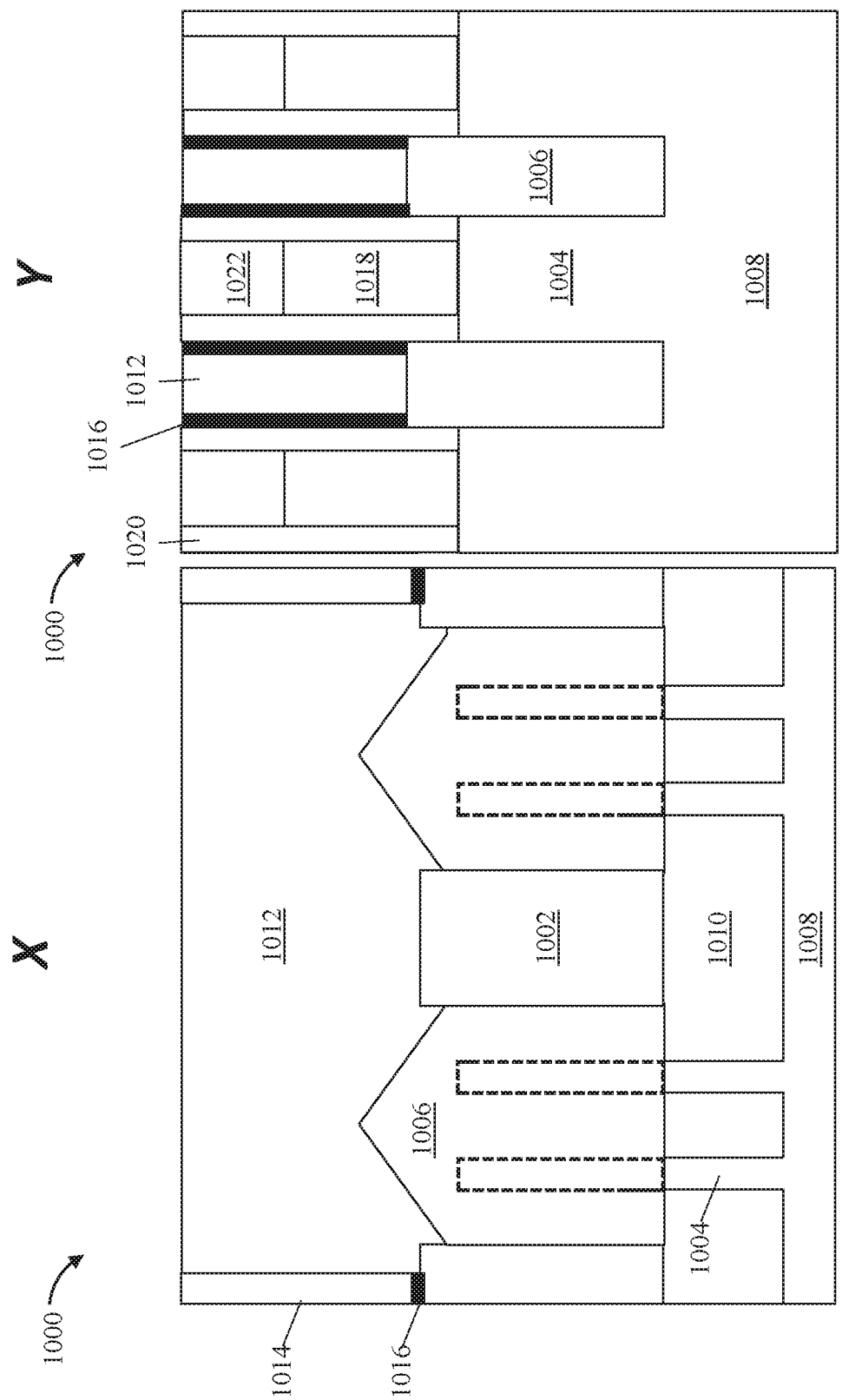

NANOSHEET TRANSISTOR WITH SELF-ALIGNED DIELECTRIC PILLAR

BACKGROUND

The present invention generally relates to fabrication methods and resulting structures for semiconductor devices, and more specifically, to a nanosheet transistor architecture having a self-aligned dielectric pillar for reducing parasitic capacitance.

Known metal oxide semiconductor field effect transistor (MOSFET) fabrication techniques include process flows for constructing planar field effect transistors (FETs). A planar FET includes a substrate (also referred to as a silicon slab), a gate formed over the substrate, source and drain regions formed on opposite ends of the gate, and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures. For example, nanosheet FETs provide increased device density and some increased performance over lateral devices. In nanosheet FETs, in contrast to conventional FETs, the channel is implemented as a stack of spaced apart nanosheets, and a gate stack wraps around the full perimeter of each nanosheet, thus enabling fuller depletion in the channel region and reducing short-channel effects due to steeper subthreshold swing (SS) and smaller drain induced barrier lowering (DIBL). The wrap-around gate structures and source/drain contacts used in nanosheet devices also enable greater management of leakage current and parasitic capacitance in the active regions, even as drive currents increase.

SUMMARY

Embodiments of the invention are directed to a method for forming a semiconductor structure having a self-aligned dielectric pillar for reducing trench silicide-to-gate parasitic capacitance. A non-limiting example of the method includes forming a nanosheet stack over a substrate. A dielectric pillar is positioned adjacent to the nanosheet stack and on a shallow trench isolation region of the substrate. The nanosheet stack is recessed to expose a surface of the shallow trench isolation region and a source or drain (S/D) region is formed on the exposed surface of the shallow trench isolation region. A contact trench is formed that exposes a surface of the S/D region and a surface of the dielectric pillar.

Embodiments of the invention are directed to a semiconductor structure. A non-limiting example of the semiconductor device includes a nanosheet stack positioned over a substrate. A dielectric pillar is positioned adjacent to the nanosheet stack and on a shallow trench isolation region of the substrate. A S/D region is positioned on a surface of the shallow trench isolation region and a trench silicide is formed on a surface of the S/D region and a surface of the dielectric pillar.

Embodiments of the invention are directed to a method for forming a semiconductor structure having a self-aligned dielectric pillar for reducing trench silicide-to-gate parasitic capacitance. A non-limiting example of the method includes forming a bottom isolation structure on a substrate and forming a nanosheet stack on the bottom isolation structure. The bottom isolation structure is positioned between the nanosheet stack and the substrate. A dielectric pillar is positioned adjacent to the nanosheet stack and on a shallow trench isolation region of the substrate. A conformal liner is formed over a S/D region and the dielectric pillar and an interlayer dielectric is positioned over the conformal liner. A portion of the interlayer dielectric and a portion of the conformal liner are removed to form a contact trench exposing a surface of the S/D region and a surface of the dielectric pillar. A trench silicide is formed in the contact trench.

Embodiments of the invention are directed to a method for forming a semiconductor structure having a self-aligned dielectric pillar for reducing trench silicide-to-gate parasitic capacitance. A non-limiting example of the method includes forming a semiconductor fin over a substrate. A dielectric pillar is positioned adjacent to the semiconductor fin and on a shallow trench isolation region of the substrate. The semiconductor fin is recessed to expose a surface of the shallow trench isolation region and a S/D region is formed on the exposed surface of the shallow trench isolation region. A contact trench is formed that exposes a surface of the S/D region and a surface of the dielectric pillar.

Embodiments of the invention are directed to a semiconductor structure. A non-limiting example of the semiconductor device includes a semiconductor fin positioned over a substrate. A dielectric pillar is positioned adjacent to the semiconductor fin and on a shallow trench isolation region of the substrate. A S/D region is positioned on a surface of the shallow trench isolation region and a trench silicide is formed on a surface of the S/D region and a surface of the dielectric pillar.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 2A depicts a cross-sectional view of a semiconductor structure along line X of FIG. 1 after a processing operation according to one or more embodiments of the invention;

FIG. 2B depicts a cross-sectional view of a semiconductor structure along line Y of FIG. 1 after a processing operation according to one or more embodiments of the invention;

FIG. 3A depicts a cross-sectional view of a semiconductor structure along line X of FIG. 1 after a processing operation according to one or more embodiments of the invention;

FIG. 3B depicts a cross-sectional view of a semiconductor structure along line Y of FIG. 1 after a processing operation according to one or more embodiments of the invention;

FIG. 5A depicts a cross-sectional view of a semiconductor structure along line X of FIG. 1 after a processing operation according to one or more embodiments of the invention;

FIG. 5B depicts a cross-sectional view of a semiconductor structure along line Y of FIG. 1 after a processing operation according to one or more embodiments of the invention;

FIG. 6A depicts a cross-sectional view of a semiconductor structure along line X of FIG. 1 after a processing operation according to one or more embodiments of the invention;

FIG. 6B depicts a cross-sectional view of a semiconductor structure along line Y of FIG. 1 after a processing operation according to one or more embodiments of the invention;

FIG. 7A depicts a cross-sectional view of a semiconductor structure along line X of FIG. 1 after a processing operation according to one or more embodiments of the invention;

FIG. 7B depicts a cross-sectional view of a semiconductor structure along line Y of FIG. 1 after a processing operation according to one or more embodiments of the invention;

FIG. 8A depicts a cross-sectional view of a semiconductor structure along line X of FIG. 1 after a processing operation according to one or more embodiments of the invention;

FIG. 8B depicts a cross-sectional view of a semiconductor structure along line Y of FIG. 1 after a processing operation according to one or more embodiments of the invention;

FIG. 9A depicts a cross-sectional view of a semiconductor structure along line X of FIG. 1 after a processing operation according to one or more embodiments of the invention;

FIG. 9B depicts a cross-sectional view of a semiconductor structure along line Y of FIG. 1 after a processing operation according to one or more embodiments of the invention;

FIG. 10A depicts a cross-sectional view of a fin-type semiconductor structure along line X of FIG. 1 after a processing operation according to one or more embodiments of the invention;

FIG. 10B depicts a cross-sectional view of a fin-type semiconductor structure along line Y of FIG. 1 after a processing operation according to one or more embodiments of the invention;

Figure 1:
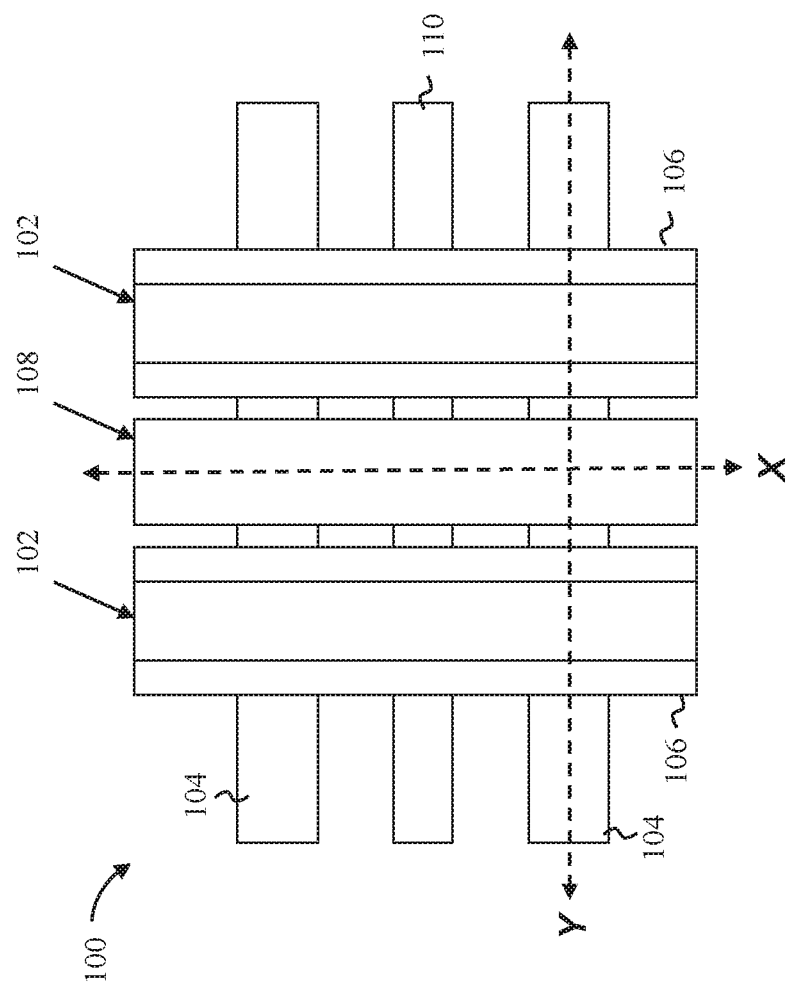
FIG. 1 depicts a top-down view of a semiconductor structure after a processing operation according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture (nanosheet transistor), embodiments of the invention are not limited to the particular transistor architectures or materials described in this specification. Rather, embodiments of the present invention are capable of being implemented in conjunction with any other type of transistor architecture (e.g., finFET) or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, continued scaling of FETs is currently limited due to the increasing parasitic capacitance associated with decreases in gate pitch. For example, in the conventional nanosheet process flow (process of record, or POR) the source/drain trench contact (sometimes referred to as TS or trench silicide) is formed via etching an interlevel dielectric (ILD). While landing the source/drain trench contact on the source/drain region(s) is beneficial as this arrangement reduces the contact resistance in the device, landing the source/drain trench contact on the isolations (e.g., shallow trench isolation, also referred to as STI) between the nanosheets in the nanosheet transistor region undesirably increases the TS-to-gate capacitance. The increase of parasitic capacitance not only slows down the circuit speed of the final device, but also increases the power consumption.

Turning now to an overview of aspects of the present invention, one or more embodiments of the invention address the above-described shortcomings of the prior art by providing a new semiconductor structure and a method for forming a semiconductor structure having a self-aligned dielectric pillar for reducing trench silicide-to-gate parasitic capacitance. In aspects of the invention, the method includes forming a buried dielectric pillar self-aligned to the nanosheet structure. In some embodiments of the invention, the dielectric pillar is positioned between the source/drain regions of adjacent nanosheet stacks. The dielectric pillar extends upwards from the substrate and serves as a etch stop for the source/drain trench contact trench patterning. Consequently, the vertical depth of the source/drain trench contact on STI is reduced. As a result, TS-to-gate capacitance is reduced. Advantageously, a dielectric pillar can be similarly incorporated in other transistor architectures, such as finFETs, to achieve equivalent reductions in parasitic capacitance.

Turning now to a more detailed description of aspects of the present invention, FIG. 1 depicts a top-down view of a semiconductor structure 100 after an initial set of fabrication operations have been applied as part of a method of fabricating a final semiconductor device according to one or more embodiments of the invention. In some embodiments of the invention, the final semiconductor device can include one or more gates 102 formed over one or more nanosheet stacks 104 (or fins, in a finFET implementation). In some embodiments of the invention, gate spacers 106 are on sidewalls of the one or more gates 102. In some embodiments of the invention, the final semiconductor device can include a source/drain trench contact 108 positioned between adjacent nanosheet stacks of the one or more nanosheet stacks 104 with respect to the line X (across nanosheet in source/drain region). In some embodiments of the invention, the final semiconductor device can include a dielectric pillar 110 positioned between adjacent nanosheet stacks of the one or more nanosheet stacks 104 with respect to the line Y (across gate in fin region). The final semiconductor device can be a variety of types of MOSFETs, including, for example, n-type nanosheet field effect transistors (NS NFETs), p-type field nanosheet field effect transistors (NS PFETs), n-type finFETs, and p-type finFETs.

FIGS. 2A and 2B depict cross-sectional views of the semiconductor structure 100 taken along the lines X (across nanosheet in source/drain region) and Y (across gate in fin region) of FIG. 1 after an initial set of fabrication operations have been applied as part of a method of fabricating a final semiconductor device according to one or more embodiments of the invention. In some embodiments of the invention, a bottom isolation structure 202 is formed over a substrate 204. In some embodiments of the invention, a nanosheet stack 206 is formed over the bottom isolation structure 202.

The bottom isolation structure 202 can be made of any suitable dielectric material such as, for example, a low-k dielectric, a nitride, silicon nitride, silicon oxide, SiON, SiC, SiOCN, or SiBCN. In some embodiments of the invention, the bottom isolation structure 202 is a single layer isolation structure. In some embodiments of the invention, the bottom isolation structure 202 is a multi-layer isolation structure. For example, the bottom isolation structure 202 can include a nitride-oxide-nitride tr-layer stack (e.g., SiN/SiO$_2$/SiN).

The substrate 204 can be made of any suitable substrate material, such as, for example, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

In some embodiments of the invention, the substrate 204 can include a buried oxide layer (not depicted). The buried oxide layer can be made of any suitable dielectric material, such as, for example, a silicon oxide. In some embodiments of the invention, the buried oxide layer is formed to a thickness of about 145 nm, although other thicknesses are within the contemplated scope of the invention.

In some embodiments of the invention, the nanosheet stack 206 can include one or more semiconductor layers 208 alternating with one or more sacrificial layers 210. In some embodiments of the invention, the semiconductor layers 208 and the sacrificial layers 210 are epitaxially grown layers. For ease of discussion reference is made to operations performed on and to a nanosheet stack 206 having three nanosheets (e.g., the semiconductor layers 208) alternating with three sacrificial layers (e.g., the sacrificial layers 210). It is understood, however, that the nanosheet stack 206 can include any number of nanosheets alternating with a corresponding number of sacrificial layers. For example, the nanosheet stack 206 can include a single nanosheet, two nanosheets, five nanosheets, eight nanosheets, or any number of nanosheets, along with a corresponding number of sacrificial layers (i.e., as appropriate to form a nanosheet stack having a bottommost sacrificial layer under a bottommost nanosheet and a sacrificial layer between each pair of adjacent nanosheets).

The semiconductor layers 208 can be made of any suitable material such as, for example, monocrystalline silicon or silicon germanium. In some embodiments of the invention, the semiconductor layers 208 are nFET nanosheets. In some embodiments of the invention, the nFET nanosheets are silicon nFET nanosheets. In some embodiments of the invention, the semiconductor layers 208 have a thickness of about 4 nm to about 10 nm, for example 6 nm, although other thicknesses are within the contemplated scope of the invention. In some embodiments of the invention, the substrate 204 and the semiconductor layers 208 can be made of a same semiconductor material. In other embodiments of the invention, the substrate 204 can be made of a first semiconductor material, and the semiconductor layers 208 can be made of a second semiconductor material.

The sacrificial layers 210 can be silicon or silicon germanium layers depending on the material of the semiconductor layers 208. For example, in embodiments where the semiconductor layers 208 are silicon nanosheets, the sacrificial layers 210 can be silicon germanium layers. In some embodiments of the invention, the sacrificial layers 210 are silicon germanium layers having a germanium concentration of about 25 percent (sometimes referred to as SiGe25), although other germanium concentrations are within the contemplated scope of the invention. In some embodiments of the invention, the sacrificial layers 210 have a thickness of about 12 nm to about 15 nm, for example 10 nm, although other thicknesses are within the contemplated scope of the invention. In some embodiments of the invention, the sacrificial layers 210 are made of a same material as the middle sacrificial layer 210 in the bottom isolation structure 202.

As shown in FIG. 2A, a shallow trench isolation region 212 (also referred to as an STI region) can be formed adjacent to the nanosheet stack 206 and the bottom isolation structure 202. In some embodiments of the invention, a trench is formed by removing portions of the nanosheet stack 206 and the bottom isolation structure 202 and an exposed surface of the substrate 204 is recessed. The trench can then be filled with dielectric material, such as, a low-k dielectric, a nitride, silicon nitride, silicon oxide, SiON, SiC, SiOCN, or SiBCN. The shallow trench isolation region 212 provides electrical isolation between the nanosheet stack 206 and other adjacent devices (such as other nanosheet stacks, or any other active device) on the substrate 204.

As shown in FIG. 2B, one or more sacrificial gates 214 (sometimes referred to as dummy gates) are formed over the nanosheet stacks 206. The portion of a nanosheet stack over which a gate is formed is referred to as a channel region. The sacrificial gates 214 can be made of any suitable material, such as, for example, amorphous silicon or polysilicon. Any known method for patterning a sacrificial gate can be used, such as, for example, a wet etch, a dry etch, or a combination of sequential wet and/or dry etches.

In some embodiments of the invention, a hard mask 216 is formed on the sacrificial gates 214. In some embodiments of the invention, the sacrificial gates 214 are formed by patterning the hard mask 216 and using a wet or dry etch process to selectively remove portions of the sacrificial gates 214 which are not covered by the patterned hard mask 216.

In some embodiments of the invention, a thin oxide layer (not shown) is formed between the nano sheet stack 206 and the sacrificial gates 214.

The hard mask 216 can be made of any suitable material, such as, for example, a silicon nitride. In some embodiments of the invention, a second hard mask (not depicted) is formed on the hard mask 216 to form a bilayer hard mask. In some embodiments, the second hard mask includes an oxide, such as, for example, silicon dioxide.

As further shown in FIG. 2B, in some embodiments of the invention, spacers 218 (also known as sidewall spacers or gate spacers) are formed on sidewalls of the sacrificial gates 214. In some embodiments of the invention, the spacers 218 are formed using a chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), physical vapor deposition (PVD), chemical solution deposition, molecular beam epitaxy (MBE), or other like process in combination with a wet or dry etch process. For example, spacer material can be conformally deposited over the semiconductor structure 100 and selectively removed using a RIE to form the spacers 218.

The spacers 218 can be made of any suitable material, such as, for example, a low-k dielectric, a nitride, silicon nitride, silicon oxide, SiON, SiC, SiOCN, or SiBCN. In some embodiments of the invention, the spacers 218 include silicon nitride. The spacers 218 can be formed to a thickness of about 5 to 40 nm, although other thicknesses are within the contemplated scope of the invention.

FIGS. 3A and 3B depict cross-sectional views of the semiconductor structure 100 taken along the lines X and Y of FIG. 1 after a processing operation according to one or more embodiments of the invention. In some embodiments of the invention, a sacrificial region 302 is formed over the nanosheet stack 206, the bottom isolation structure 202, and the shallow trench isolation region 212.

In some embodiments of the invention, the sacrificial region 302 includes silicon germanium layers having a germanium concentration selected to provide etch selectivity with respect to the nanosheet stack 206. For example, in some embodiments of the invention, the sacrificial layers 210 are silicon germanium layers having a germanium concentration of about 25 percent and the sacrificial region 302 is made of silicon germanium having a germanium concentration of about 60 percent (sometimes referred to as SiGe60).

The sacrificial region 302 provides for a widening of the source/drain regions in the final device (as shown in FIGS. 5A and 5B). In some embodiments of the invention, the sacrificial region 302 is optional. A widening of the source/drain is advantageous for finFETs because fins are typically narrow and the gaps between fins are large. A widening of the source/drain for nanosheets is optional for relatively wide nanosheets having widths greater than about 20 nm as the gaps between nanosheets is already small; however, widening is useful for narrow fins having widths less than about 20 nm.

Figures 4A, 4B:
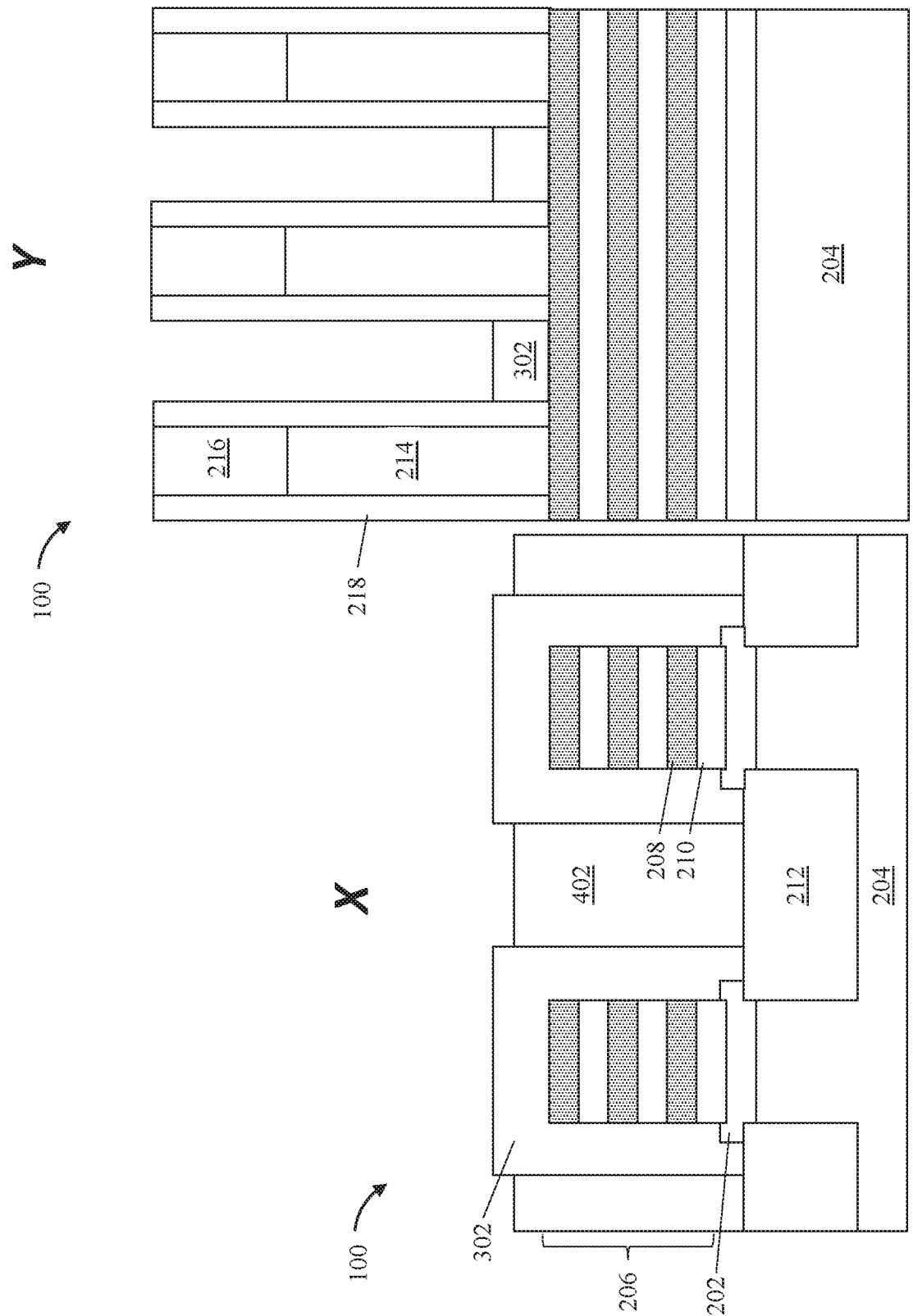
FIG. 4A depicts a cross-sectional view of a semiconductor structure along line X of FIG. 1 after a processing operation according to one or more embodiments of the invention.
FIG. 4B depicts a cross-sectional view of a semiconductor structure along line Y of FIG. 1 after a processing operation according to one or more embodiments of the invention.

FIGS. 4A and 4B depict cross-sectional views of the semiconductor structure 100 taken along the lines X and Y of FIG. 1 after a processing operation according to one or more embodiments of the invention. In some embodiments of the invention, a dielectric pillar 402 is formed between the nanosheet stack 106 and an adjacent nanosheet stack.

In some embodiments of the invention, the dielectric pillar 402 includes silicon carbide (SiC), although other dielectric materials are within the contemplated scope of the invention. In some embodiments of the invention, the dielectric pillar 402 is formed by filling the gaps between the sacrificial region 302 (e.g., between the enlarged source/drain regions) by conformal deposition of a dielectric material followed by an etch back.

FIGS. 5A and 5B depict cross-sectional views of the semiconductor structure 100 taken along the lines X and Y of FIG. 1 after a processing operation according to one or more embodiments of the invention. In some embodiments of the invention, the sacrificial region 302 can be removed and the nanosheet stack 206 can be recessed to expose a surface of the bottom isolation structure 202 and a surface of the shallow trench isolation region 212. The sacrificial region 302 can be removed and the nanosheet stack 206 can be recessed using a wet etch, a dry etch, or a combination of wet and/or dry etches. In some embodiments of the invention, the sacrificial region 302 is removed and the nanosheet stack is recessed using one or more etches selective to the bottom isolation structure 202. For example, silicon, SiGe25, and SiGe60 can be removed selective to silicon nitride using vapor phase HCl or vapor phase $ClF_3$, among other options.

As further shown in FIG. 5B, the sacrificial layers 210 can be recessed and inner spacers 502 can be formed on the recessed sidewalls of the sacrificial layers 210. For example, sidewalls of the sacrificial layers 210 can be recessed to form cavities in the nanosheet stack 206. In some embodiments of the invention, the inner spacers 502 are formed on recessed sidewalls of the sacrificial layers 210 by filling these cavities with dielectric material. In some embodiments of the invention, portions of the inner spacers 502 that extend beyond sidewalls of the nanosheet stack 206 are removed, using, for example, a reactive ion etch (RIE). In this manner, sidewalls of the inner spacers 502 are coplanar to sidewalls of the semiconductor layers 208.

In some embodiments of the invention, the inner spacers 502 are formed using a CVD, PECVD, ALD, PVD, chemical solution deposition, or other like processes in combination with a wet or dry etch process. The inner spacers 502 can be made of any suitable material, such as, for example, a low-k dielectric, a nitride, silicon nitride, silicon dioxide, SiON, SiC, SiOCN, or SiBCN.

FIGS. 6A and 6B depict cross-sectional views of the semiconductor structure 100 taken along the lines X and Y of FIG. 1 after a processing operation according to one or more embodiments of the invention. In some embodiments of the invention, source and drain regions 602 are formed on the bottom isolation structure 202 between opposite sidewalls of the dielectric pillar 402. In some embodiments of the invention, the source and drain regions 602 are formed to a thickness (height) of 10 nm or more, for example 40 nm to 70 nm, although other thicknesses are within the contemplated scope of the invention.

The source and drain regions 602 can be epitaxially grown using, for example, vapor-phase epitaxy (VPE), molecular beam epitaxy (MBE), liquid-phase epitaxy (LPE), or other suitable processes. The source and drain regions 602 can be semiconductor materials epitaxially grown from gaseous or liquid precursors.

In some embodiments of the invention, the gas source for the epitaxial deposition of semiconductor material includes a silicon containing gas source, a germanium containing gas source, or a combination thereof. For example, a Si layer can be epitaxially deposited (or grown) from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. A germanium layer can be epitaxially deposited from a germanium gas source that is selected from the group consisting of germane, digermane, halogermane, dichlorogermane, trichlorogermane, tetrachlorogermane and combinations thereof. A silicon germanium alloy layer can be epitaxially formed utilizing a combination of such gas sources. Carrier gases like hydrogen, nitrogen, helium and argon can be used. In some embodiments of the invention, the epitaxial semiconductor materials include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Epitaxially grown silicon and silicon germanium can be doped by adding n-type dopants (e.g., P or As) or p-type dopants (e.g., Ga, B, $BF_2$, or Al). In some embodiments of the invention, the source and drain regions 602 can be epitaxially formed and doped by a variety of methods, such as, for example, in-situ doped epitaxy (doped during deposition), doped following the epitaxy, or by implantation and plasma doping. The dopant concentration in the doped regions can range from $1\times10^{19}$ $cm^{-3}$ to $2\times10^{21}$ $cm^{-3}$, or between $1\times10^{20}$ $cm^{-3}$ and $1\times10^{21}$ $cm^{-3}$.

In some embodiments of the invention, the source and drain regions 602 are made of silicon or silicon germanium. In some embodiments of the invention, the source and drain regions 602 are made of silicon germanium having a germanium concentration of about 10 to about 65 percent, for example, 50 percent, although other germanium concentrations are within the contemplated scope of the invention.

FIGS. 7A and 7B depict cross-sectional views of the semiconductor structure 100 taken along the lines X and Y of FIG. 1 after a processing operation according to one or more embodiments of the invention. In some embodiments of the invention, a liner 702 is formed over the source and drain regions 602 and the dielectric pillar 402.

In some embodiments of the invention, the liner 702 is conformally deposited using, for example, ALD, although other conformal deposition processes are within the contemplated scope of the invention. The liner 702 can be made of any suitable material, such as, for example, a low-k dielectric, a nitride, silicon nitride, SiON, SiC, SiOCN, or SiBCN. In some embodiments of the invention, the liner 702 includes a silicon nitride (e.g., SiN). The liner 702 can be formed to a nominal (conformal) thickness of about 5 nm or less, or 3 nm or less, although other thicknesses are within the contemplated scope of the invention.

In some embodiments of the invention, an interlayer dielectric 704 is formed over the liner 702. The interlayer dielectric 704 serves as an isolation structure for the semiconductor device 100. The interlayer dielectric 704 can be made of any suitable dielectric material, such as, for example, porous silicates, carbon doped oxides, silicon dioxides, silicon nitrides, silicon oxynitrides, silicon carbide (SiC), or other dielectric materials. In some embodiments of the invention, the interlayer dielectric 704 includes SiO2. Any known manner of forming the interlayer dielectric 704 can be utilized, such as, for example, CVD, PECVD, ALD, flowable CVD, spin-on dielectrics, or PVD. In some embodiments of the invention, the interlayer dielectric 704 and the shallow trench isolation regions 212 are made of the same dielectric material.

As shown in FIG. 7B, the sacrificial layers 210, the sacrificial gates 214, and the hard mask 216 can be removed and replaced with gates 706 (sometimes referred to as active or conductive gates).

The gates 706 can be high-k metal gates (HKMGs) formed over a channel region of the nanosheet stack 206 using, for example, known replacement metal gate (RMG) processes, or so-called gate-first processes. As used herein, the "channel region" refers to the portion of the semiconductor layers 208 over which the gates 706 are formed, and through which a current passes from source to drain in the final device (not shown). In some embodiments of the invention, the gates 706 are formed by removing the sacrificial gates 214, selectively removing the sacrificial layers 210 to release the nanosheet channel (semiconductor layers 208 in the channel region), and depositing the high-k/metal gate materials into the cavity left after removing the sacrificial gates 214 and the sacrificial layers 210.

In some embodiments of the invention, the gates 706 can include a gate dielectric(s) (not shown) and a work function metal stack (not shown). In some embodiments, the gates 706 includes a main body formed from bulk conductive gate material(s).

In some embodiments of the invention, the gate dielectric is a high-k dielectric film formed on a surface (sidewall) of the semiconductor layers 208. The high-k dielectric film can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the high-k dielectric film can have a thickness of about 0.5 nm to about 4 nm. In some embodiments of the invention, the high-k dielectric film includes hafnium oxide and has a thickness of about 1 nm, although other thicknesses are within the contemplated scope of the invention.

In some embodiments of the invention, the gates 706 include one or more work function layers (sometimes referred to as a work function metal stack) formed between the high-k dielectric film and a bulk gate material. In some embodiments of the invention, the gates 706 include one or more work function layers, but do not include a bulk gate material.

If present, the work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layer can serve to modify the work function of the gates 706 and enables tuning of the device threshold voltage. The work function layers can be formed to a thickness of about 0.5 to 6 nm, although other thicknesses are within the contemplated scope of the invention. In some embodiments of the invention, each of the work function layers can be formed to a different thickness. In some embodiments of the invention, the work function layers include a TiN/TiC/TiCAl stack.

In some embodiments, the gates 706 include a main body formed from bulk conductive gate material(s) deposited over the work function layers and/or gate dielectrics. The bulk gate material can include any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive gate material can further include dopants that are incorporated during or after deposition.

As further depicted in FIG. 7B, the gates 706 can include gate hard masks 708. The gate hard masks 708 can be made of any suitable material, such as, for example, silicon nitride. As the gate hard masks 708 are aligned to the gates 706 in the space between the spacers 218, the gate hard masks 1002 can be thought of as self-aligned hard masks (sometimes referred to as SAC caps).

FIGS. 8A and 8B depict cross-sectional views of the semiconductor structure 100 taken along the lines X and Y of FIG. 1 after a processing operation according to one or more embodiments of the invention. In some embodiments of the invention, portions of the liner 702 and the interlayer dielectric 704 are removed to form a contact trench 802 that exposes a surface of the source and drain regions 602.

In some embodiments of the invention, portions of the liner 702 and the interlayer dielectric 704 are removed selective to the dielectric pillar 402. In other words, the dielectric pillar 402 can serve as an etch stop for TS trench patterning. Any known method for patterning dielectric material can be used, such as, for example, a wet etch, a dry etch, or a combination of sequential wet and/or dry etches. In some embodiments of the invention, a patterned mask (not shown) is formed over the interlayer dielectric 704 and exposed portions of the liner 702 and the interlayer dielectric 704 are removed using, for example, one or more RIEs.

FIGS. 9A and 9B depict cross-sectional views of the semiconductor structure 100 taken along the lines X and Y of FIG. 1 after a processing operation according to one or more embodiments of the invention. In some embodiments of the invention, the contact trench 802 is filled with conductive material (e.g., Co) to form a trench silicide 902. In some embodiments of the invention, the trench silicide 902 overfills the contact trench 802, forming an overburden extending from the surface of the interlayer dielectric 704. In some embodiments of the invention, the overburden is removed using, for example chemical-mechanical planarization (CMP).

As shown in FIG. 9A, the trench silicide 902 lands on a top surface of the source and drain regions 602 as well as a top surface of the dielectric pillar 402. As described previously, landing the trench silicide 902 on the top surface of the source and drain regions 602 reduces contact resistance, while landing on the top surface of the dielectric pillar 402 (rather than on the shallow trench isolation as in the conventional process flow) reduces the TS-to-gate parasitic capacitance by reducing the vertical depth of the trench silicide 902 on the shallow trench isolation 212.

FIGS. 10A and 10B depict cross-sectional views of a fin-type semiconductor structure 1000 taken along the lines X and Y of FIG. 1 after a processing operation according to one or more embodiments of the invention. In contrast to the nanosheet-type implementation shown in FIGS. 9A and 9B, the semiconductor structure 1000 shown in FIGS. 10A and 10B depicts a finFET type implementation of a dielectric pillar for reducing parasitic capacitance.

In some embodiments of the invention, the semiconductor structure 1000 can include a dielectric pillar 1002 formed between semiconductor fins 1004 in a similar manner as the dielectric pillar 402 was formed adjacent to the nanosheet stack 206 in FIG. 9A. In some embodiments of the invention, the semiconductor structure 1000 can include source/drain regions 1006 formed over a substrate 1008, in a similar manner as shown with respect to FIGS. 9A and 9B. In some embodiments of the invention, the semiconductor structure 1000 can include a shallow trench isolation region 1010 between adjacent fins of the semiconductor fins 1004, in a similar manner as shown with respect to FIGS. 9A and 9B.

In some embodiments of the invention, the semiconductor structure 1000 can include a trench silicide 1012 formed between opposite sidewalls of an interlayer dielectric 1014, in a similar manner as shown with respect to FIGS. 9A and 9B. In some embodiments of the invention, the semiconductor structure 1000 can include a liner 1016 between the interlayer dielectric 1014 and the dielectric pillar 1002, in a similar manner as shown with respect to FIGS. 9A and 9B.

In some embodiments of the invention, the semiconductor structure 1000 can include a gate (e.g., high-k metal gate) 1018, formed over channel regions of the semiconductor fins 1004, in a similar manner as shown with respect to FIGS. 9A and 9B. In some embodiments of the invention, the gate 1018 is formed between gate spacers 1020, in a similar manner as shown with respect to FIGS. 9A and 9B. In some embodiments of the invention, the gate 1018 includes a gate cap 1022, in a similar manner as shown with respect to FIGS. 9A and 9B.

Figure 11:
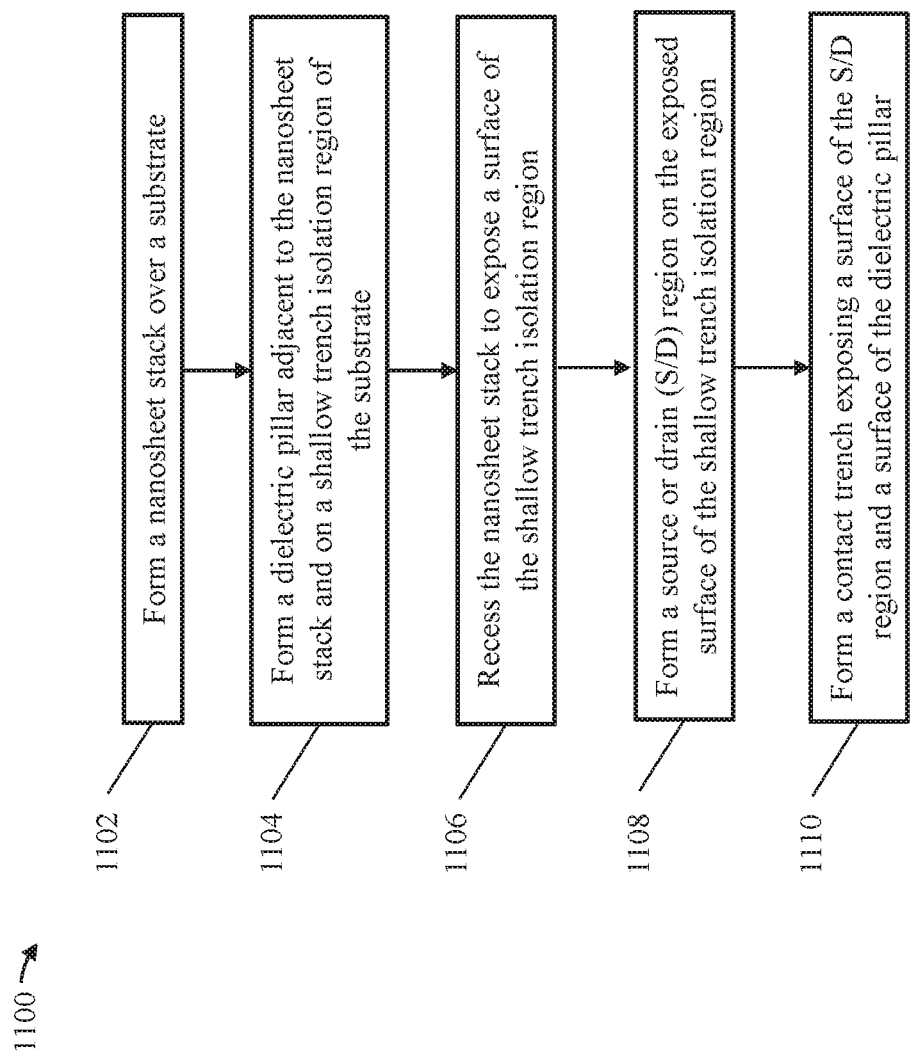
FIG. 11 depicts a flow diagram illustrating a method according to one or more embodiments of the invention.

FIG. 11 depicts a flow diagram 1100 illustrating a method for forming a semiconductor device according to one or more embodiments of the invention. As shown at block 1102, a nanosheet stack is formed over a substrate. At block 1104, a dielectric pillar is formed adjacent to the nanosheet stack. The dielectric pillar is positioned on a shallow trench isolation region of the substrate.

At block 1106, the nanosheet stack is recessed to expose a surface of the shallow trench isolation region. In some embodiments of the invention, recessing the nanosheet stack includes removing the sacrificial region. At block 1108, a source or drain (S/D) region is formed on the exposed surface of the shallow trench isolation region.

At block 1110, a contact trench is formed that exposes a surface of the S/D region and a surface of the dielectric pillar. In some embodiments of the invention, the dielectric pillar serves as an etch stop while forming the contact trench. In some embodiments of the invention, a trench silicide is formed in the contact trench.

The method can further include forming a bottom isolation structure between the substrate and the nanosheet stack. In some embodiments of the invention, prior to forming the dielectric pillar, a sacrificial region is formed over the nanosheet stack. The sacrificial region can serve to widen the source/drain region, as discussed previously herein.

In some embodiments of the invention, a conformal liner is formed over the S/D region and the dielectric pillar. In some embodiments of the invention, an interlayer dielectric is formed over the conformal liner. In some embodiments of the invention, forming the contact trench includes removing a portion of the interlayer dielectric and a portion of the conformal liner.

Figure 12:
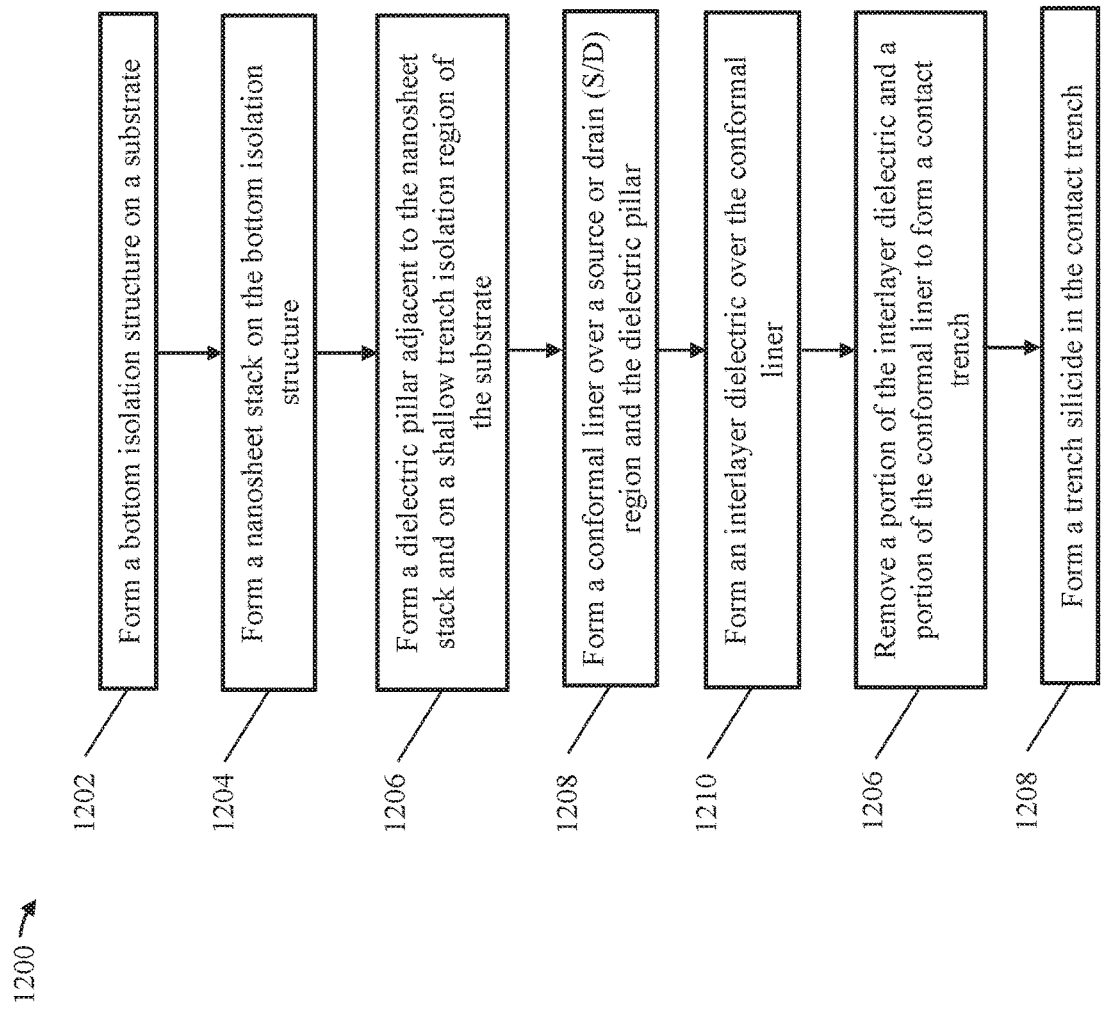
FIG. 12 depicts a flow diagram illustrating a method according to one or more embodiments of the invention.

FIG. 12 depicts a flow diagram 1200 illustrating a method for forming a semiconductor device according to one or more embodiments of the invention. As shown at block 1202, a bottom isolation structure is formed on a substrate. At block 1204, a nanosheet stack is formed on the bottom isolation structure. The bottom isolation structure is positioned between the nanosheet stack and the substrate.

At block 1206, a dielectric pillar is formed adjacent to the nanosheet stack. The dielectric pillar is positioned on a shallow trench isolation region of the substrate. In some embodiments of the invention, the dielectric pillar serves as an etch stop while forming the contact trench in block 1212.

At block 1208, a conformal liner over a S/D region and the dielectric pillar. At block 1210, an interlayer dielectric is formed over the conformal liner. At block 1212, a portion of the interlayer dielectric and a portion of the conformal liner are removed to form a contact trench exposing a surface of the S/D region and a surface of the dielectric pillar. At block 1214, a trench silicide is formed in the contact trench.

In some embodiments of the invention, prior to forming the dielectric pillar, a sacrificial region is formed over the nanosheet stack. In some embodiments of the invention, the nanosheet stack is recessed to expose a surface of the shallow trench isolation region. In some embodiments of the invention, recessing the nano sheet stack includes removing the sacrificial region.

Figure 13:
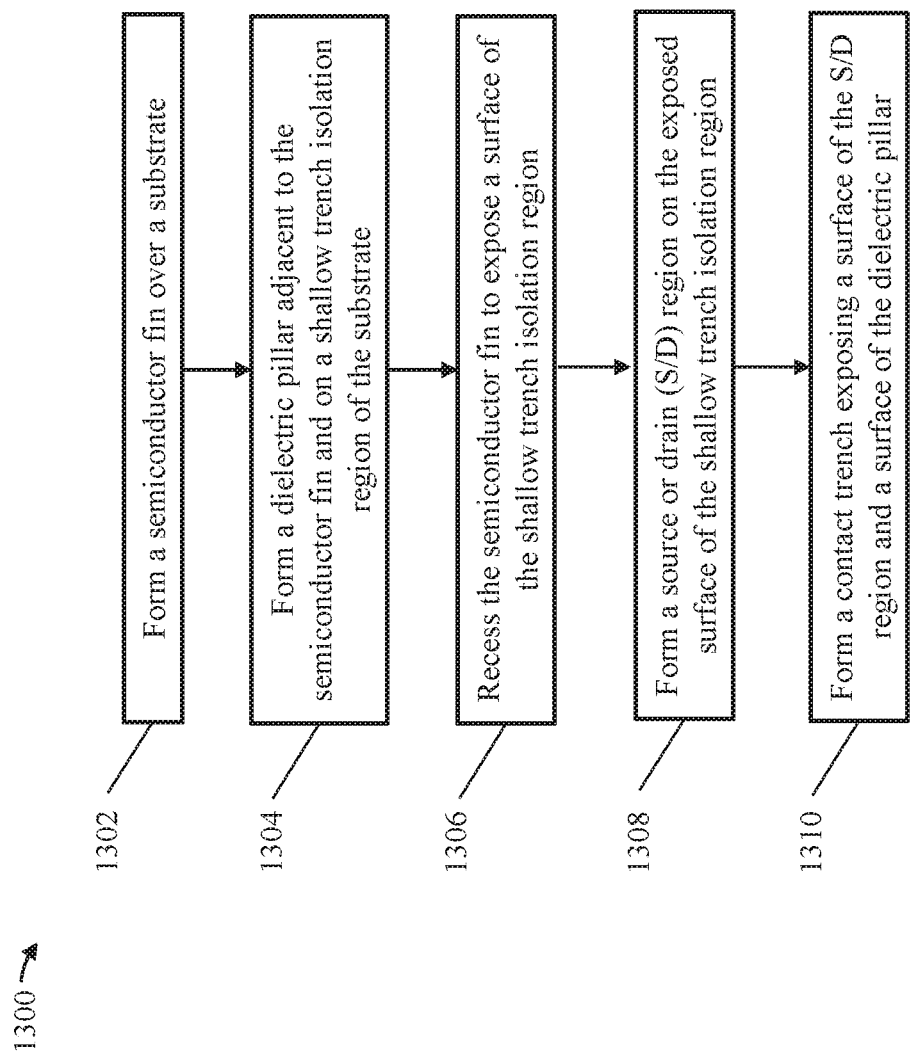
FIG. 13 depicts a flow diagram illustrating a method according to one or more embodiments of the invention.

FIG. 13 depicts a flow diagram 1300 illustrating a method for forming a semiconductor device according to one or more embodiments of the invention. As shown at block 1302, a semiconductor fin is formed over a substrate. At block 1304, a dielectric pillar is formed adjacent to the semiconductor fin. The dielectric pillar is positioned on a shallow trench isolation region of the substrate.

At block 1306, the semiconductor fin is recessed to expose a surface of the shallow trench isolation region. In some embodiments of the invention, recessing the semiconductor fin includes removing the sacrificial region. At block 1308, a source or drain (S/D) region is formed on the exposed surface of the shallow trench isolation region.

At block 1310, a contact trench is formed that exposes a surface of the S/D region and a surface of the dielectric pillar. In some embodiments of the invention, the dielectric pillar serves as an etch stop while forming the contact trench. In some embodiments of the invention, a trench silicide is formed in the contact trench.

In some embodiments of the invention, prior to forming the dielectric pillar, a sacrificial region is formed over the semiconductor fin. The sacrificial region can serve to widen the source/drain region, as discussed previously herein.

In some embodiments of the invention, a conformal liner is formed over the S/D region and the dielectric pillar. In some embodiments of the invention, an interlayer dielectric is formed over the conformal liner. In some embodiments of the invention, forming the contact trench includes removing a portion of the interlayer dielectric and a portion of the conformal liner.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a <100> orientated crystalline surface can take on a <100> orientation. In some embodiments of the invention of the invention, epitaxial growth and/or deposition processes can be selective to forming on semiconductor surface, and may or may not deposit material on other exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
    forming a bottom isolation structure on a substrate;
    forming a nanosheet stack on the bottom isolation structure, the bottom isolation structure between the nanosheet stack and the substrate;
    forming a sacrificial region over the nanosheet stack, the sacrificial region in direct contact with the bottom isolation structure;
    forming a dielectric pillar adjacent to the nanosheet stack, the dielectric pillar positioned directly on a shallow trench isolation region of the substrate, the dielectric pillar in direct contact with sidewalls of the sacrificial region;
    removing the sacrificial region to expose a surface of the bottom isolation structure and a surface of the shallow trench isolation region;
    forming a conformal liner over a source or drain (S/D) region and the dielectric pillar;
    forming an interlayer dielectric over the conformal liner;
    removing a portion of the interlayer dielectric and a portion of the conformal liner to form a contact trench exposing a surface of the S/D region and a surface of the dielectric pillar; and
    forming a trench silicide in the contact trench.

2. The method of claim 1 further comprising recessing the nanosheet stack to expose a surface of the shallow trench isolation region, wherein recessing the nanosheet stack comprises removing the sacrificial region.

3. The method of claim 1, wherein the dielectric pillar serves as an etch stop while forming the contact trench.

* * * * *